United States Patent
Lichtensteiger et al.

(10) Patent No.: US 10,029,277 B2
(45) Date of Patent: Jul. 24, 2018

(54) METHOD OF PRODUCING LARGE-SCALE LAYERS OF SOLID MATERIAL

(71) Applicant: SILTECTRA GmbH, Dresden (DE)

(72) Inventors: Lukas Lichtensteiger, Zurich (CH); Jan Richter, Dresden (DE); Wolfram Drescher, Dresden (DE)

(73) Assignee: Siltectra, GmbH, Dresden (DE)

( * ) Notice: Subject to any disclaimer, the term of this patent is extended or adjusted under 35 U.S.C. 154(b) by 0 days.

(21) Appl. No.: 15/101,783

(22) PCT Filed: Dec. 4, 2014

(86) PCT No.: PCT/EP2014/076496
§ 371 (c)(1),
(2) Date: Jun. 3, 2016

(87) PCT Pub. No.: WO2015/082582
PCT Pub. Date: Jun. 11, 2015

(65) Prior Publication Data
US 2017/0029974 A1  Feb. 2, 2017

(30) Foreign Application Priority Data
Dec. 4, 2013 (DE) .................. 10 2013 020 693

(51) Int. Cl.
*B05D 3/00* (2006.01)
*H01L 21/304* (2006.01)
(Continued)

(52) U.S. Cl.
CPC .............. *B05D 3/007* (2013.01); *C30B 1/023* (2013.01); *C30B 29/406* (2013.01); *C30B 33/00* (2013.01);
(Continued)

(58) Field of Classification Search
None
See application file for complete search history.

(56) References Cited

U.S. PATENT DOCUMENTS

| 2010/0022074 A1 | 1/2010 | Wang |
| 2012/0318334 A1 | 12/2012 | Bedell |

(Continued)

FOREIGN PATENT DOCUMENTS

WO 2013113730 8/2013

OTHER PUBLICATIONS

International Search Report of corresponding international application PCT/EP2014/076496.

(Continued)

*Primary Examiner* — Michael P Rodriguez
(74) *Attorney, Agent, or Firm* — Great Lakes Intellectual Property, PLLC

(57) ABSTRACT

The invention relates to a method of producing at least one layer of solid material. This method comprises at the very least the steps of: providing a carrier substrate with a first exposed surface and with a second exposed surface; producing a detachment layer in the carrier substrate or over the first exposed surface of the carrier substrate, the detachment layer having an exposed surface; producing the first layer of solid material over the exposed surface of the detachment layer, the first layer of solid material having a free surface spaced apart from the detachment layer; positioning or forming a receiving layer on the second exposed surface of the carrier substrate or on the free surface of the first layer of solid material; generating stresses within the detachment layer, the stresses being generated by tempering at least the receiving layer, a crack propagating within the detachment layer or in the boundary region between the detachment layer and the first layer of solid material as a result of the (Continued)

stresses, the first layer of solid material being split off from the previously produced multi-layer arrangement by the crack.

1 Claim, 8 Drawing Sheets

(51) Int. Cl.
    *H01L 21/02*     (2006.01)
    *H01L 31/18*     (2006.01)
    *C30B 1/02*     (2006.01)
    *C30B 29/40*     (2006.01)
    *C30B 33/00*     (2006.01)
    *H01L 33/00*     (2010.01)
    *H01L 33/32*     (2010.01)

(52) U.S. Cl.
    CPC ...... *H01L 21/02002* (2013.01); *H01L 21/304* (2013.01); *H01L 31/1804* (2013.01); *H01L 33/0075* (2013.01); *H01L 33/0079* (2013.01); *H01L 33/32* (2013.01); *Y02E 10/547* (2013.01); *Y02P 70/521* (2015.11)

(56) References Cited

U.S. PATENT DOCUMENTS

2012/0322244 A1* 12/2012 Bedell .................. H01L 21/187
                                                                                       438/478
2013/0005119 A1     1/2013 Bedell
2016/0064283 A1*   3/2016 Lichtensteiger ...... H01L 21/304
                                                                                       438/458

OTHER PUBLICATIONS

Written Opinion of the International Searching Authority of corresponding international application PCT/EP2014/076496.

* cited by examiner

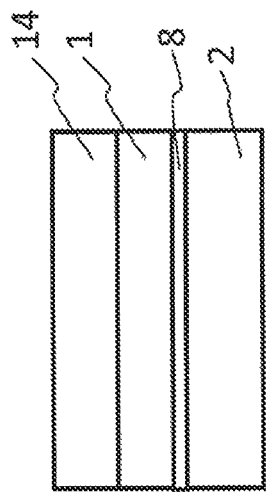
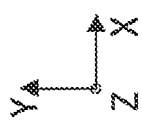
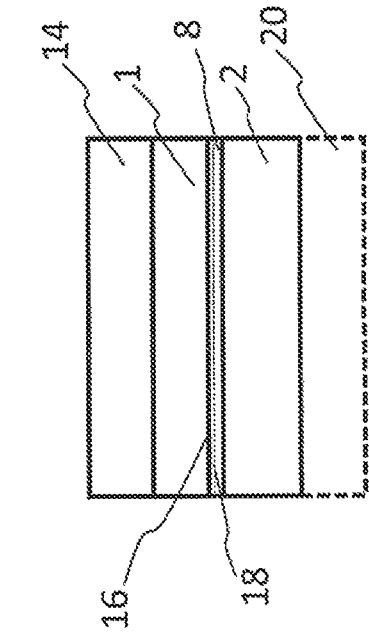
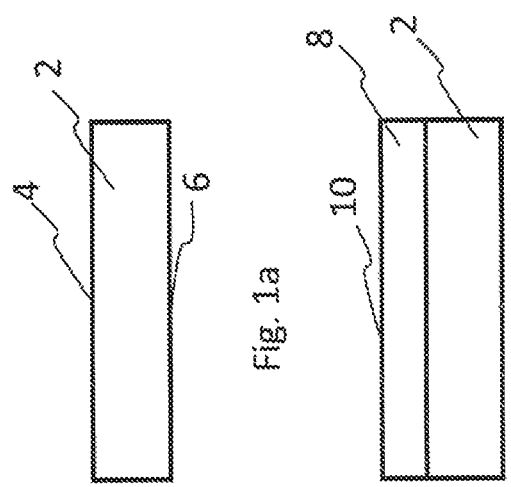

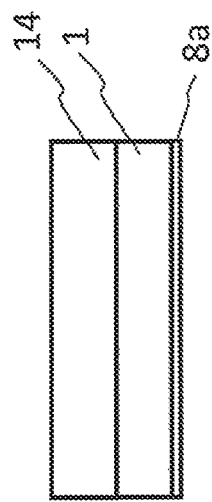

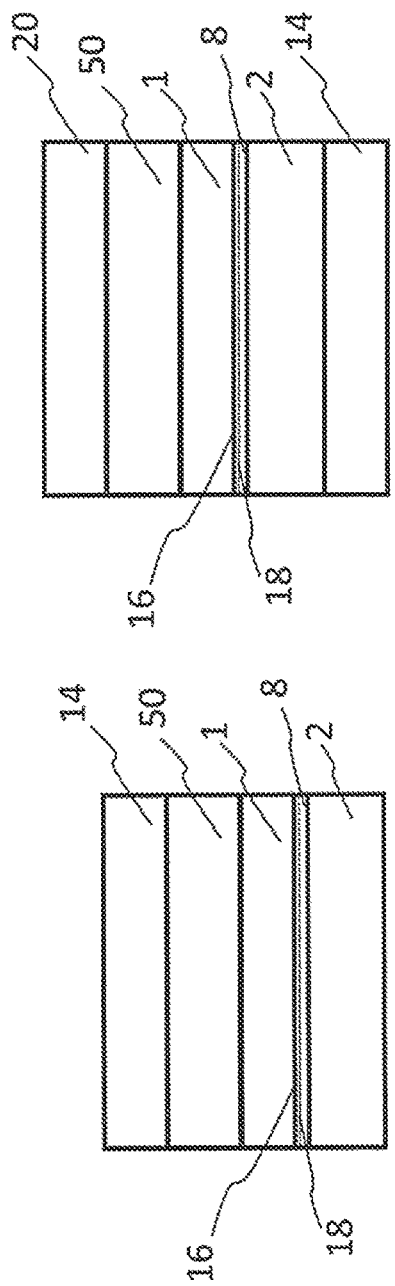
Fig. 4a
Fig. 4b
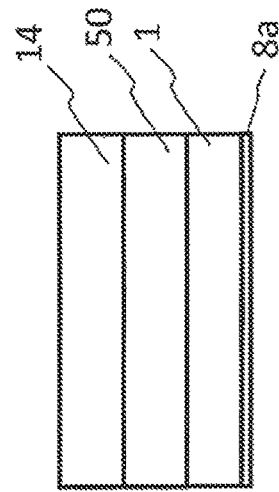
Fig. 4c
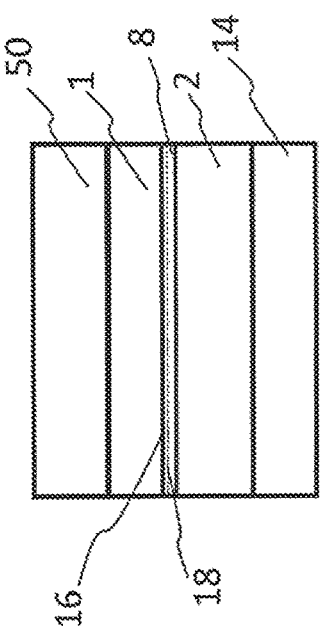
Fig. 4d

METHOD OF PRODUCING LARGE-SCALE LAYERS OF SOLID MATERIAL

The present invention relates to a method of producing a layer of solid material, and it relates to a solid material layer arrangement produced by this method.

Layers of solid material are produced in a very laborious and cost-intensive manner e.g. in semiconductor technology, by means of which relatively small improvements can bring about clear cost savings or greater efficiency.

According to an article by Mr Jan Oliver Löfken entitled "Extremely thin separation layer helps to detach the wafer-thin semiconductor stack more easily from the base" thin layers of the semiconductor gallium nitride are the key to brightly radiant blue and white light emitting diodes. The article also discloses that an extremely smooth and clean base made of sapphire forms the necessary basis for thin gallium nitride layers. Only over these synthetically produced substrates can the crystalline semiconductor layers of the required quality then be produced. However, the separation of the gallium nitride layers with the costly use of lasers proves to be difficult here because gallium nitride builds up stable bonds with the sapphire carrier. The sapphire base is therefore first of all vaporised with a layer of boron nitride that is only three millionths of a millimeter thick. They then stacked onto these a number of layers of gallium nitride which were partially displaced with the elements aluminium and indium. In principle, this stack already corresponds to a blue light emitting diode, but it must still be detached from the sapphire carrier. By means of the previously applied separation layer of boron nitride the whole stack is then lifted off of the sapphire carrier purely mechanically without using lasers.

This solution is disadvantageous because the purely mechanical lifting off of the layers produced can easily lead to damage of the layers that are produced or of the carrier substrate.

It is therefore the object of the present invention to provide a method of producing one or more layers of solid material and a layer of solid material produced by this method, the risk of damaging the layer that is produced and/or the carrier substrate being reduced by the invention.

According to the invention the aforementioned object is achieved by a method of producing a layer of solid material or a number of layers of solid material or a multi-layer arrangement according to Claim 1. The method according to the invention comprises at the very least the steps of providing a carrier substrate with a first exposed surface and with a second exposed surface, producing a detachment layer in the carrier substrate or over the first exposed surface of the carrier substrate, the detachment layer having an exposed surface, producing the layer of solid material, in particular a first layer of solid material, over the exposed surface of the detachment layer, the layer of solid material having a free surface spaced apart from the detachment layer, positioning or forming a receiving layer on the second exposed surface of the carrier substrate or on the free surface of the layer of solid material, generating stresses within the detachment layer, the stresses being generated by tempering at least the receiving layer, a crack propagating within the detachment layer or in the boundary region between the detachment layer and layer of solid material as a result of the stresses, the layer of solid material being split off from the previously produced multilayer arrangement by the crack.

This solution is advantageous because by separating the layer of solid material that has been produced from the carrier substrate, clearly larger layers of solid material can be produced in terms of area as a result of thermally induced crack propagation within the detachment layer because the loading of the layer of solid material that takes place during the generation and propagation of cracks is clearly less with respect to the purely "mechanical detachment" known from the prior art.

Additional embodiments are the subject matter of the sub-claims.

According to a preferred embodiment of the present invention the detachment layer is configured such that it differs significantly from the same mechanical property of another layer, in particular the layer of solid material, in at least one mechanical property, in particular breaking strength. This embodiment is advantageous because the crack initiation and the crack propagation are simplified by the different mechanical properties.

According to another preferred embodiment of the present invention the detachment layer is produced porously, in particular nanoporously, over or in the carrier substrate such that the breaking strength of the detachment layer is less than the breaking strength of the layer of solid material. Instead of pores, it is also conceivable for defects to be generated or introduced within the detachment layer upon producing the detachment layer or after producing the detachment layer, particularly preferably the breaking strength of the detachment layer being reduced by the defects. This embodiment is advantageous because the generation of the pores within the detachment layer can preferably be controlled, and in this way the desired properties can be created or adjusted in a defined manner. Furthermore, the porous layer is advantageous because it is not necessarily, but can optionally be produced more quickly in comparison to an epitaxially produced layer. Furthermore, a porous detachment layer can be made of the same material as that of the carrier substrate. However, it is also conceivable for the detachment layer to be made of a material or material composition here that is different from the material of the carrier substrate.

According to another preferred embodiment of the present invention the detachment layer is grown on the substrate and is provided with doping, by means of the doping the breaking strength of the detachment layer being adjusted or influenced such that it is less than the breaking strength of the layer of solid material. This embodiment is advantageous because the doping of the detachment layer can be undertaken very precisely, by means of which at least one mechanical property, in particular breaking strength, can be specifically manipulated or adjusted.

In addition or alternatively it is, however, also possible for the detachment layer to be produced by transforming an amorphous layer previously produced over or in the carrier layer into a crystalline layer, the carrier substrate being in a crystalline state, and by transforming the amorphous layer into the crystalline detachment layer the crystal lattice information on the crystal lattice of the carrier substrate being transferred to the detachment layer. This embodiment is advantageous because a very thin layer of solid material can be produced very precisely. The detachment layer servos here on the one hand as a sacrificial layer that can easily be destroyed, by means of which the layer of solid material that is produced can be removed easily and reliably from the carrier substrate. On the other hand, the detachment layer passes the crystal lattice information of the carrier material onto the layer of solid material when producing the layer of solid material. If the carrier substrate is made e.g. of sapphire, the detachment layer is made of silicon and the layer of solid material is also made of sapphire, the relatively lower strength of the silicon can thus be utilised to separate the sapphire layer of solid material produced with the crystal lattice information of the sapphire carrier substrate from the sapphire carrier substrate.

Instead of or in addition to doping, it is also conceivable for defects to be generated or introduced within the detachment layer while producing the detachment layer or after producing the detachment layer, particularly preferably the breaking strength of the detachment layer in turn being reduced by the defects. Furthermore, it is conceivable for pores to be generated in the detachment layer and additionally for doping of the detachment layer to take place or for the detachment layer to be partially or entirely doped. The detachment layer can comprise e.g. boron nitrite or be made of boron nitrite.

According to another preferred embodiment of the present invention the detachment layer is produced over or in the carrier substrate as an amorphous layer. Preferably, the layer of solid material is composed of a base layer portion and of a main layer portion, the base layer portion particularly preferably being produced directly or indirectly over the amorphous detachment layer, and the main layer portion being produced over the base layer portion. The base layer portion and the main layer portion are preferably made of the some material or the same material composition. However, it is also conceivable for the base layer portion and the main layer portion to be made of different materials or material compositions.

According to another preferred embodiment of the present invention the crack propagates in a separation plane within the detachment layer, the separation plane extending parallel to the second surface a the carrier substrate and/or parallel to the surface of the layer of solid material positioned on the detachment layer, the separation plane preferably lying in a region of the detachment layer that is further away from the carrier substrate than from the layer of solid material. This embodiment is advantageous because it means that the portion of the detachment layer remaining on the layer of solid material is very thin and extends less with respect to the overall extension of the detachment layer in the Y direction or in a direction at right angles to the largest surface, in terms of area, of the detachment plane extending in a plane than before the separation or splitting off. Preferably, the remaining portion of the detachment layer after splitting off has a thickness that is less than half, a quarter, an eighth or a sixteenth of the overall thickness of the detachment layer before splitting off. The portion of the detachment layer remaining on the layer of solid material after splitting off is preferably detached or broken off by machining, in particular by grinding and/or chemically. Furthermore, it is conceivable for the layer of solid material and the detachment layer to be separated from one another or split off precisely in a border region between these layers. This border region is preferably the region in which the detachment layer and the layer of solid material are in contact with one another.

According to another preferred embodiment of the present invention the detachment layer and the layer of solid material are each at least partially produced by growing on or vapour deposition, and the layer of solid material is preferably made of a semiconductor material or the layer of solid material preferably comprises a semiconductor material, in particular gallium nitrite (GaN) or gallium arsenide (GaAs), auf. However, it is also conceivable for the detachment layer to be produced in a first step, and in another step for it to be positioned on or connected onto the carrier substrate. Furthermore, it is conceivable for the carrier substrate to be modified, in particular without growing on the detachment layer, such that it forms an inner layer, in particular without any increase in thickness, which serves as a detachment layer and on which the layer of solid material is directly or indirectly disposed, produced or grown.

According to another preferred embodiment the layer solid material has a surface that is larger than or equal to 10 $cm^2$ and is preferably larger than or equal to 100 $cm^2$. This embodiment is advantageous and only possible due to the splitting off process according to the invention because such large-scale layers of solid material, in particular certain semiconductor materials, would be destroyed or damaged by purely mechanical lifting.

According to another preferred embodiment of the present invention the stresses are generated by cooling at the very least the receiving layer that is preferably made of a polymeric material, in particular PDMS, to a temperature of less than 10° C., in particular OT less than 0° C. and particularly preferably of less than −100° C. Furthermore, it is conceivable for the receiving layer to be tempered or cooled to the glass transition temperature of the material of the receiving layer.

PDMS Sylgard 184 made by Dow Corning can preferably be used to produce the receiving layer. This is a two-component mixture that is thermally cured (e.g. mixing ratios between curing agent base material of preferably 1:100 to 1:1 and particularly preferably of 1:10 to 1:3). Depending on the curing time—ambient temperature up to approx. 300° C. and preferably up to 200° C., preferably ambient temperature up to approx. 120° C., can be provided for curing. Preferably, curing times of between approx. 1-60 minutes (at high temperatures) and 1-6 days (at ambient temperature) can be provided. Before curing PDMS Sylgard 184 is a viscous liquid that is applied to a preferably smooth surface (e.g. a mirror) e.g. by means of a casting method and is cured here to form a film that is adhered to the layer of solid material. Alternatively, however, it is also possible to produce the receiving layer in situ on the layer of solid material and to cure it on the latter.

It is therefore possible to produce polymer layers with different elasticity moduli by processing the polymer being used in different ways (in particular by different curing processes) depending on the requirement. Moreover, the elasticity modulus of the polymer used is greatly dependent upon temperature (with a distinct glass transition at approx. ~125° C., the elasticity modulus increasing by a number of orders of magnitude). It is therefore also possible to produce corresponding regions/layers with different elasticity moduli by specifically producing regions/layers with different temperatures in the polymer. Under certain circumstances, physical values other than the temperature can also influence the elasticity modulus of a corresponding polymer layer locally, and can then be used for the specific production of regions/layers with different elasticity moduli.

According to another preferred embodiment of the present invention an additional receiving layer is provided, the receiving layer being formed on the second exposed surface of the carrier substrate and the additional receiving layer being positioned on the free surface of the layer of solid material. This embodiment is advantageous because the two parts of the original multi-layer arrangement resulting from the split can be received and held in a secure and stable manner. Furthermore, it is conceivable for stresses to be able to be introduced into the multi-layer arrangement via surfaces of the multi-layer arrangement lying one over the other by means of the receiving layers. Alternatively, however, it is also conceivable for the carrier substrate to be fixed by means of a holding device while the receiving layer is subjected to heat so that stresses are generated within the detachment layer in order to spilt off the layer of solid material.

According to another preferred embodiment of the present invention at least one additional layer of solid material is produced or positioned on the multi-layer arrangement before splitting off the first layer of solid material, the additional layer of solid material preferably also being split off as a result of thermally induced stresses of the multi-layer arrangement, or the additional layer of solid material being split off together with the first layer of solid material. It is conceivable here for one or more additional layers of solid material, in particular e.g. at least, precisely or a maximum of 2, 3, 4, 5, 6, 7, 8, 9, 10, 15, 20, 25 or 30 layers of solid material, to be produced or be positioned on the multi-layer arrangement. Preferably, the first layer of solid material and the second layer of solid material comprise the same material or different materials. Preferably, the first layer of solid material and the additional layer of solid material are made of the same material. Furthermore, it is conceivable for the first layer of solid material and the additional layer of solid material to be formed or positioned or grown on the multi-layer arrangement at the same time or with a time delay.

Furthermore, the present invention relates to a solid material layer arrangement. The solid material layer arrangement preferably comprises at least a first layer of solid material, in particular made of gallium nitrite, and is produced by any of the previously specified methods or by a method that comprises at the very least the steps of providing a carrier substrate with a first exposed surface and with a second exposed surface; producing a detachment layer in the carrier substrate or over the first exposed surface of the carrier substrate, the detachment layer having an exposed surface; producing the first layer of solid material over the exposed surface of the detachment layer, the first layer of solid material having a free surface spaced apart from the detachment layer; positioning or forming a receiving layer on the second exposed surface of the carrier substrate or on the free surface of the first layer of solid material; generating stresses within the detachment layer, the stresses being generated by tempering at least the receiving layer, a crack propagating within the detachment layer or in the boundary region between the detachment layer and the first layer of solid material as a result of the stresses, the first layer of solid material being split off from the previously produced multi-layer arrangement by the crack.

According to another preferred embodiment of the present invention at least one additional layer of solid material, in particular made of gallium nitrite, is provided, the additional layer of solid material being split off together with the first layer of solid material.

According to another preferred embodiment of the present invention an additional carrier substrate is produced or positioned on, in particular bonded onto the layer of solid material or on another layer of solid material, the first layer of solid material and/or the at least or precisely one additional layer of solid material or a number of additional layers of solid material forming a multi-layer arrangement with the additional carrier substrate, in particular a glass or silicon layer, after the splitting off. This embodiment is advantageous because the layer of solid material that has been produced or the layers of solid material that have been produced can simply be further processed by means of the additional carrier substrate.

Furthermore, the present invention can relate to a layer of solid material, in particular to a layer of gallium nitrite, the layer of solid material being produced by any of the aforementioned methods. The method according to the invention comprises here at the very least the steps; providing a carrier substrate with a first exposed surface and with a second exposed surface; producing a detachment layer over the first exposed surface of the carrier substrate, the detachment layer having an exposed surface; producing the layer of solid material over the exposed surface of the detachment layer, the layer of solid material having a free surface spaced apart from the detachment layer; positioning or forming a receiving layer on the second exposed surface of the carrier substrate or on the free surface of the layer of solid material; producing stresses within the detachment layer, the stresses being generated by tempering at least the receiving layer, a crack propagating within the detachment layer or in the boundary region between the detachment layer and the layer of solid material as a result of the stresses, the layer of solid material being split off from the previously produced multi-layer arrangement by the crack.

According to another preferred embodiment of the present invention the thickness of the detachment layer is smaller than 1 μm, preferably smaller than 100 nm or smaller than 50 nm and particularly preferably smaller than 10 nm. This embodiment is advantageous because the detachment layer thus only brings about a very small degree of material consumption. Furthermore, any material portions of the detachment layer which are to be removed from the layer of solid material after separation of the detachment layer are very small.

Further advantages, aims and properties of the present invention are explained by means of the following description of the attached drawings in which the production of the layer of solid material according to the invention is shown as an example. Elements of the production of the layer of solid material according to the invention which correspond at least substantially as regards their function in the figures can be identified here with the same reference numbers, these components or elements not having to be numbered or explained in all of the figures.

The figures show as follows:

FIGS. 1a-1e different layer arrangements according to the method according to the invention;

FIGS. 2a and 2b additional layer arrangements according to the method according to the invention;

FIGS. 3a-3d another layer arrangement version according to the invention with another carrier layer:

FIGS. 4a-4d different examples relating to the generation of stresses within the detachment layer;

FIGS. 5a-5d another layer arrangement version according to the invention with another carrier layer and at least one other layer of solid material;

FIGS. 6a-6d different examples relating to the generation of stresses within the detachment layer in a layer arrangement in accordance with FIGS. 5c and/or 5d;

FIG. 7 shows diagrammatically a composite arrangement before and after splitting; and FIGS. 8a-8c show diagrammatically arrangements for the transfer of the lattice information of a crystalline carrier substrate to the layer of solid material to be produced.

FIG. 1a, shows a carrier substrate 2 that preferably extends level, i.e. has a first level or a substantially level exposed surface 4 and a second level or substantially level exposed surface 6. The first exposed surface 4 of the carrier substrate 2 is preferably spaced apart parallel or substantially parallel to the second exposed surface 6 of the carrier substrate 2. The carrier substrate 2 can be made at least partially or entirely of a material that comprises sapphire and/or silicon and/or silicon carbide. However, it is also conceivable for the carrier substrate 2 to be made entirely or exclusively or by more than 90% of sapphire and/or silicon and/or silicon carbide.

In FIG. 1b, compared with FIG. 1a an additional layer is formed on the earner substrate 2, in particular on one side or on the first exposed surface 4 of the carrier substrate 2. The additional layer is preferably a grown on layer, in particular a grown on detachment layer 8. The detachment layer 8 can therefore preferably be formed or produced as an epitaxial layer. Furthermore, it is however conceivable for the detachment layer 8 to be produced first of all, and then to be connected to the carrier substrate 2 or be coupled to the latter. Furthermore, it is conceivable for the carrier substrate 2 to have one or a number more coatings and for the detachment layer 8 to be positioned or produced on one of these layers. Reference number 10 identifies an exposed surface on which or above which (in the Y direction) a layer of solid material 1 is produced or formed (see FIG. 1c). The detachment layer 8 is preferably less than 100 µm, particularly preferably less than 50 µm and extremely preferably less than 20 µm thick and preferably only extends this far in the thickness direction or in the Y direction. Preferably, the detachment layer 8 has a breaking strength which is less than the breaking strength of another layer, in particular of the layer of solid material 1 or of the carrier substrate 2. Particularly preferably the detachment layer 8 is made to be porous, in particular nanoporous, i.e. the detachment layer 8 preferably has pores, the majority of pores preferably having a diameter of less than or equal to 10 µm or of less than or equal to 5 µm. The porous detachment layer 8 is preferably produced by tempering, in particular at a temperature of between 500° C. and 2000° C., such as e.g. at 1100° C., a layer of material applied to the carrier substrate. Furthermore, it is conceivable for the porous detachment layer 8 to be produced in the carrier substrate 2 e.g. by a surface treatment method. The surface treatment method can be e.g. a cauterising process here, in particular an electrochemical cauterising process. In addition, or alternatively, it is conceivable for the detachment layer 8 to be doped.

According to FIG. 1c the layer of solid material 1 is formed on the detachment layer 8 or over the detachment layer 8. The layer of solid material 1 is preferably a grown on layer. Therefore, the layer of solid material 1 can preferably be formed or produced as an epitaxial layer. Furthermore, it is conceivable for the detachment layer 8 to have one or a number more coatings and for the layer of solid material 1 to be positioned or produced on one of these layers. The layer of solid material 1 can be formed here as a layer that preferably comprises a semiconductor material, such as e.g. gallium phosphide (GaP), indium phosphide (InP), indium antimonide (InSb), indium arsenide (InAs), gallium antimonide (GaSb), gallium nitride (GaN), aluminium nitride (AlN), indium nitride (InN), aluminium gallium arsenide ($Al_xGA_{1-x}As$) and/or indium gallium nitride ($In_xGa_{1-x}N$), or is made of the latter. Reference number 12 identifies a free surface of the layer of solid material 1. The free surface 12 is or is preferably formed to be level or substantially level. Particularly preferably the free surface 12 is aligned parallel or substantially parallel to the surface 10 of the detachment layer 8.

FIG. 1d shows that a receiving layer 14 is positioned or produced on the multi-layer arrangement consisting at the very least of the carrier substrate 2, the detachment layer 8 and the layer of solid material 1. In this illustration the receiving layer 14 is applied to or is formed on the initially free surface 12 of the layer of solid material 1. Additionally or alternatively it is, however, also conceivable for the receiving layer 14 to be positioned, formed or produced on the second exposed surface 6 of the carrier substrate 2. The receiving layer 14 can preferably be positioned, formed or produced at any time on the carrier substrate 2, i.e. the receiving layer 14 can be positioned or produced e.g. before producing or positioning the detachment layer 8 or before producing or positioning the layer of solid material 1 on the carrier substrate 2.

Preferably, an additional receiving layer 20 is provided in addition to the receiving layer 14 (see FIG. 1e). If a number of receiving layers are provided, it is conceivable for the individual receiving layers 14, 20 to have different properties. Particularly preferably, the individual receiving layers 14, 20 are, however, made at least partially of the same material, in particular of polydimethyl siloxane (PDMS). Preferably the receiving layer 14 or the receiving layers 14, 20 are pre-produced film-like layers that are particularly preferably applied to the carrier substrate 2 and/or to the layer of solid material 1 by means of an adhesive, in particular liquid PDMS. However, it is alternatively also conceivable for one or both of the receiving layers 14, 20 to be produced in situ.

In FIG. 1e the illustration shown in FIG. 1d is supplemented by an additional receiving layer 20 shown by dashes. As stated with regard to FIG. 1d the additional receiving layer 20 may be optional. It is therefore conceivable for just one receiving layer 14 to be provided, produced, positioned or formed, the one receiving layer 14 then being able to be provided, produced, positioned or formed on the carrier substrate 2 or on the layer of solid material 1.

Reference number 16 identifies a boundary region between the detachment layer 8 and the layer of solid material 1. The boundary region 16 preferably constitutes the interface between the surface 10 and the layer of solid material 1. Furthermore, reference number 18 identifies, for example, a separation plane within which a crack for the separation of the layer of solid material 1 propagates. Preferably, the separation plane 16 is spaced only a few µm, in particular less than 20 µm or less than 10 µm or less than 5 µm apart from the boundary region 18.

FIG. 2a shows an example of a possible layer composition after the splitting of the detachment layer 8. On the one hand the split off remainder of the detachment layer 8 is still positioned on or adhered to the layer of solid material 1, and on the other hand the receiving layer 14 is still positioned or adhered.

FIG. 2b only shows the layer of solid material 1 that is produced. The remaining portion 8a of the detachment layer 8 and the receiving layer 14 shown in FIG. 2 have been or are removed from the layer of solid material 1. It is conceivable here for the portion 8a of the detachment layer 8 and the receiving layer 14 to be removed one after the other or simultaneously by machining, thermal, chemical and/or mechanical methods. Preferably, a different method is used for removing the remaining portion 8a of the detachment layer 8 than for the removal of the receiving layer 14.

Therefore the invention relates to a method for the production of a layer of solid material 1. The method comprises at least the following steps here:
providing a carrier substrate 2 with a first exposed surface 4 and with a second exposed surface 6;
producing a detachment layer 8 over the first exposed surface 4 of the carrier substrate 2, the detachment layer 8 having an exposed surface 10;

producing the layer of solid material 1 over the exposed surface 10 of the detachment layer 8, the layer of solid material 1 having a free surface 12 spaced apart from the detachment layer 8;

positioning or forming a receiving layer 14 on the second exposed surface 6 of the carrier substrate 2 or on the free surface 12 of the layer of solid material 1;

generating stresses within the detachment layer 8, the stresses being generated by tempering at least the receiving layer 14, a crack propagating within the detachment layer 8 or within the boundary region 16 between the detachment layer 8 and the layer of solid material 1 as a result of the stresses, the layer of solid material 1 being split off from the previously produce multi-layer arrangement by the crack.

FIG. 3a shows a layer arrangement as already described according to FIG. 1c.

According to FIG. 3b an additional carrier layer or an additional carrier substrate 50 is formed, produced or positioned, in particular bonded onto the first layer of solid material 1. In this connection the carrier substrate 50 can be in the form of e.g. a glass layer, a silicon layer or a sapphire layer. However, it is also conceivable for the carrier substrate 50 to be made of other materials or material combinations.

In FIGS. 3c and 3d the receiving layer 14 is positioned or formed either on one side of the carrier substrate 2 or on one side of the additional carrier substrate 50. Preferably, the receiving layer 14 is positioned on one side of one of these carrier substrates 2, 50, an additional receiving layer 20 being positioned on one side of the other carrier substrate. Preferably, the receiving layer 14 is positioned directly on a carrier substrate 2 or 50, and this also applies particularly preferably to the additional receiving layer 20. Thus, an additional carrier substrate 50 is produced or positioned, in particularly bonded onto the layer of solid material 1 or onto an additional layer of solid material 100 (see FIG. 5b), the first layer of solid material 1 and/or the additional layer of solid material 100 (see FIG. 5b) forming a multi-layer arrangement with the additional carrier substrate 50, in particular a glass or silicon layer, after the splitting off.

In FIG. 4a the receiving layer 14 is positioned on the additional earner layer 50 or on one side of the additional carrier layer 50. In FIG. 4b the receiving layer 14 is positioned on the carrier layer 2 or on one side of the carrier layer 2. According to FIG. 4c the additional receiving layer 20 is positioned on one side of the additional carrier substrate 50 or on the additional carrier substrate 50, and the receiving layer 14 is positioned on one side of the carrier substrate 2 or is positioned on the carrier substrate 2.

FIG. 4d shows a multi-layer arrangement according to the invention as preferably configured after the splitting off. It is conceivable here for the remaining part 8a of the detachment layer and/or the receiving layer 14 to be removed.

Figure 3A:
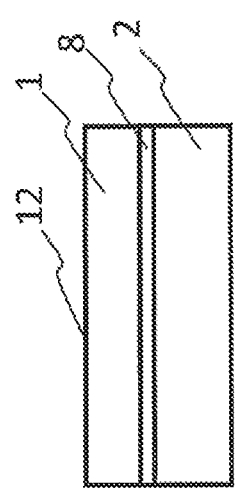
Figure 3B:
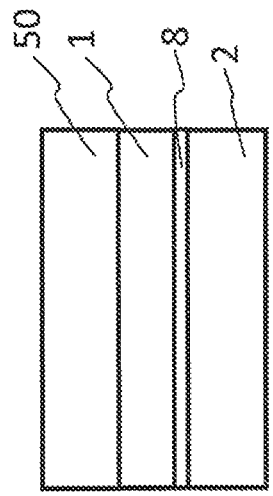
Figure 3C:
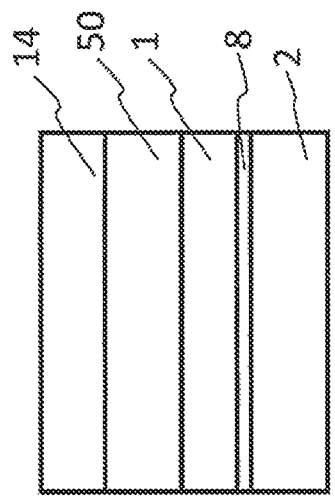
Figure 3D:
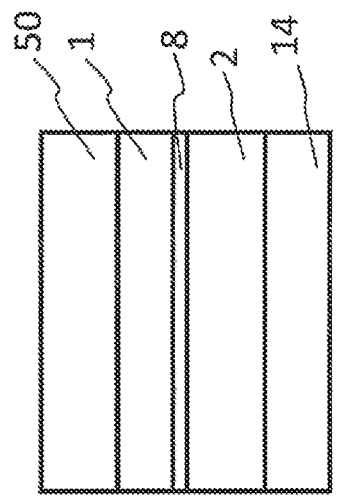
Figure 5A:
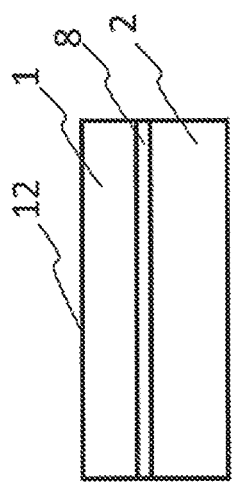
FIG. 5a shows a layer arrangement as already described according to FIG. 1c.
Figure 5B:
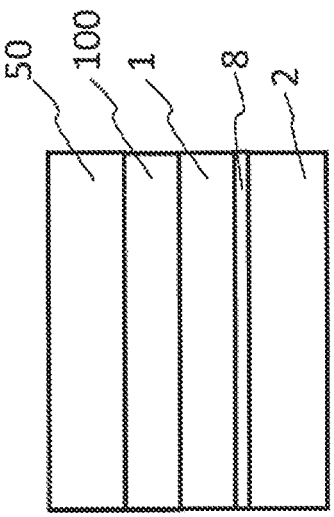

According to FIG. 5b an additional layer of solid material 100 is positioned, produced or formed between the first layer of solid material 1 and the additional carrier layer 50. It is conceivable here for precisely, at least or maximum or up to 1, 2, 3, 4, 5, 6, 7, 8, 9, 10, 15, 20 additional layers of solid material to be able to be positioned, formed or produced in addition to the additional layer of solid material 100. Furthermore, it is conceivable for the receiving layer 14 to be positioned or produced instead of the additional carrier substrate 50 on the additional layer of solid material 100.

Figure 5C:
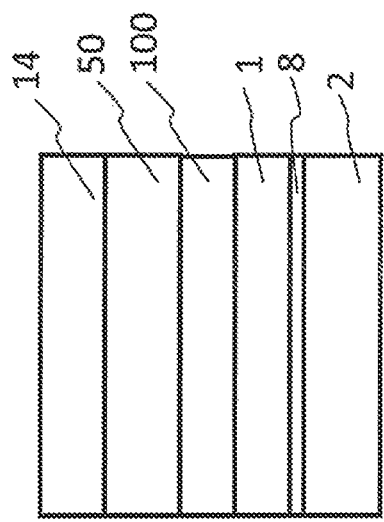
Figure 5D:
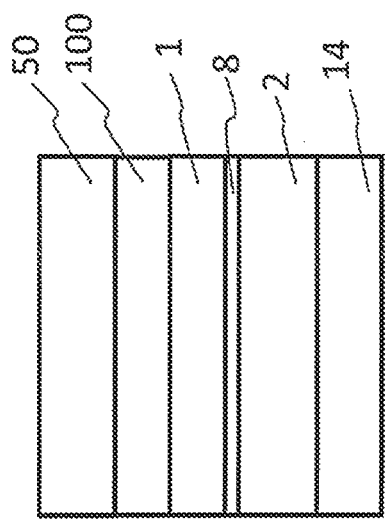

In FIGS. 5c and 5d the receiving layer 14 is positioned or formed either on one side of the carrier substrate 2 or on one side of the additional carrier substrate 50. Preferably, the receiving layer 14 is positioned on one side of one of these carrier substrates 2, 50, an additional receiving layer 20 being positioned on one side of the other carrier substrate. Preferably, the receiving layer 14 is positioned directly on a carrier substrate 2 or 50, and this also applies particularly preferably to the additional receiving layer 20.

Figure 6A:
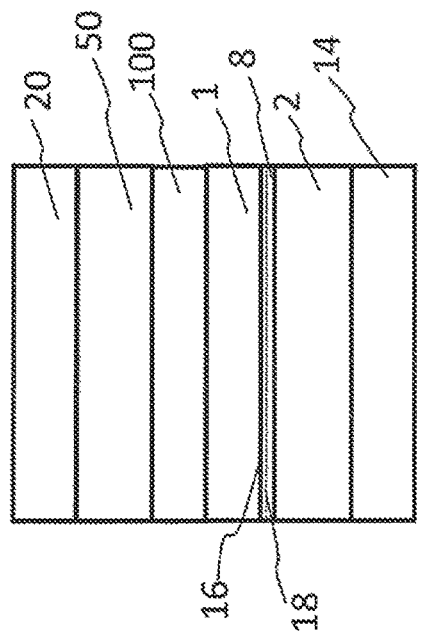
Figure 6B:
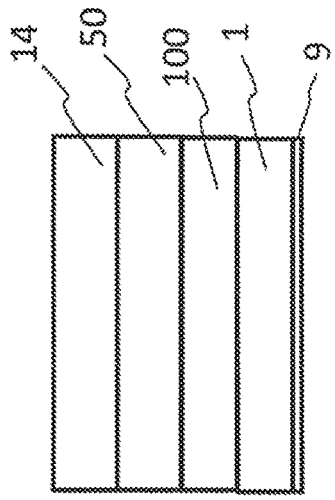
Figure 6C:
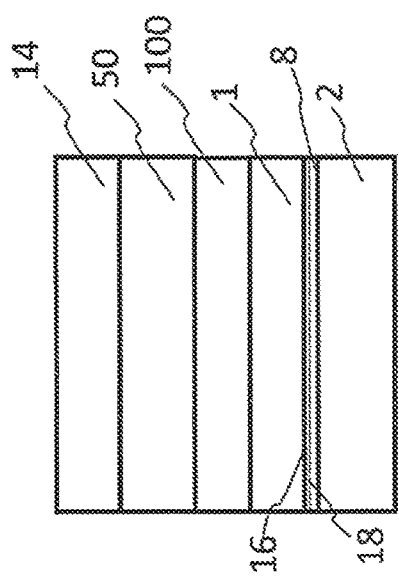

In FIG. 6a the receiving layer 14 is positioned on the additional carrier layer 50 or on one side of the additional carrier layer 50. In FIG. 6b the receiving layer 14 is positioned on the carrier layer 2 or on one side of the carrier layer 2. According to FIG. 6c the additional receiving layer 20 is positioned on one side of the additional carrier substrate 50 or on the additional carrier substrate 50, and the receiving layer 14 is positioned on one side of the carrier substrate 2 or on the carrier substrate 2.

Figure 6D:
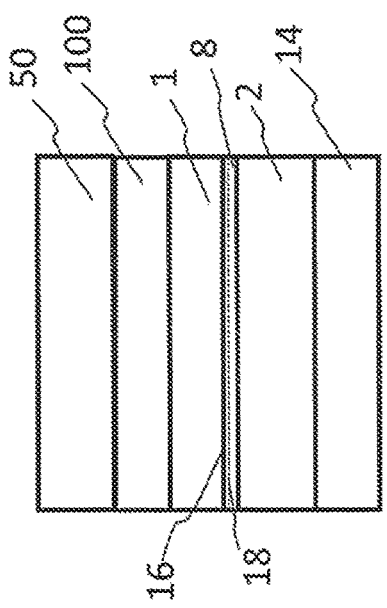

FIG. 6d shows a multi-layer arrangement according to the invention, as preferably configured after the splitting off. It is conceivable here for the remaining part 8a of the detachment layer B and/or the receiving layer 14 to be removed.

Figure 7:
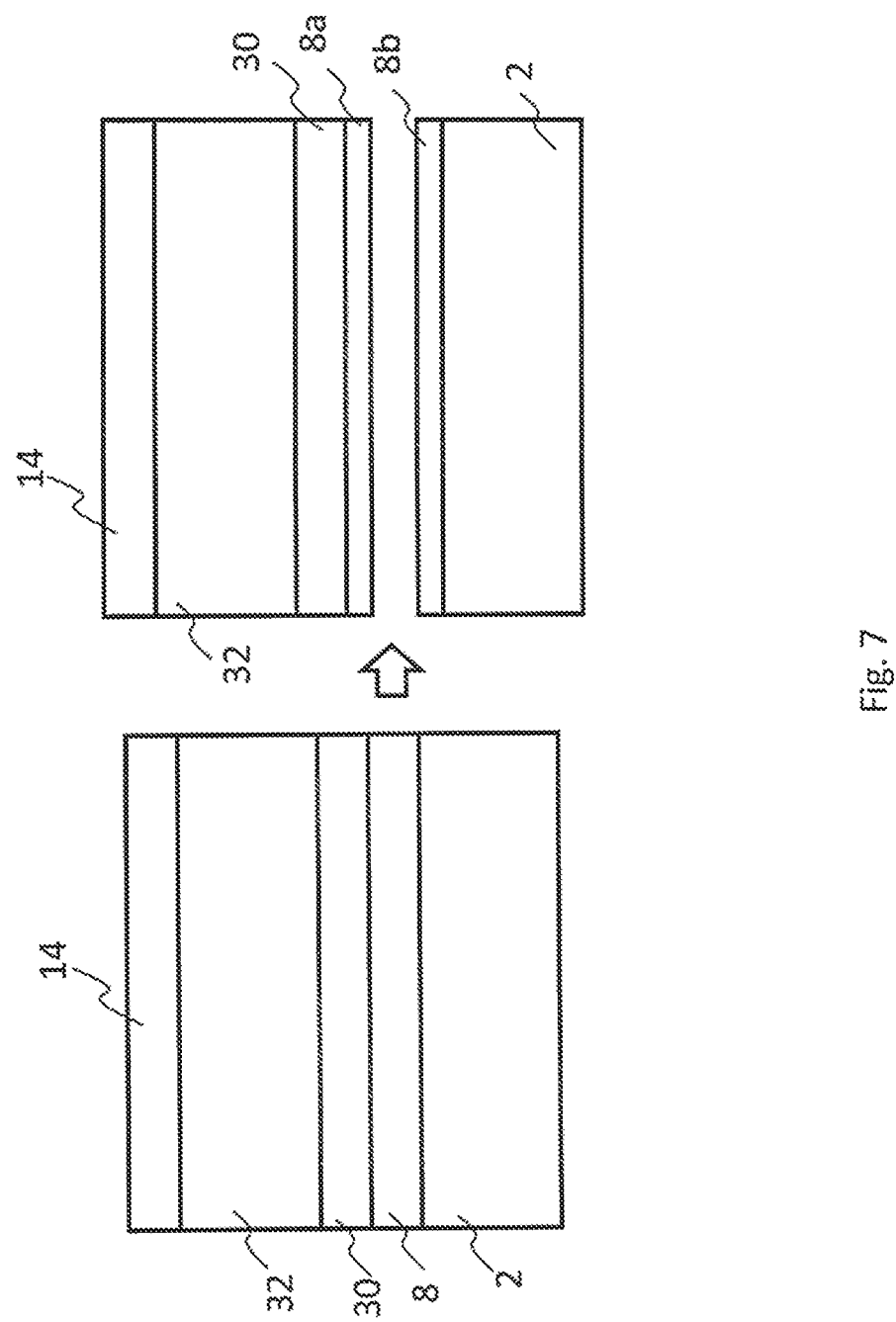

FIG. 7 shows a composite structure in which the detachment layer is produced over or in the carrier substrate as an amorphous layer. The layer of solid material 1 is composed here of a base layer portion 30 and of a main layer portion 32, the base layer portion 30 being produced over the amorphous detachment layer 8 and the main layer portion 32 being produced over the base layer portion 30. The arrow symbolises the splitting process here and points to the state after the splitting process. After the splitting process the detachment layer 8 is divided into a first portion 8a and into a second portion 8b. The first portion 8a is still connected to the separated layer of solid material 1 and the second portion 8b is still connected to the carrier substrate 2.

According to an advantageous material combination the carrier substrate 2 preferably comprises silicon or is preferably made of silicon, the detachment layer 8 preferably comprises amorphous silicon or is preferably made of amorphous silicon, the base layer portion 30 is preferably made of a base layer material, in particular of silicon, and the main layer portion 32 preferably comprises silicon or is preferably made of silicon. By means of this material combination one can advantageously produce layers of solid material made of silicon which are suitable e.g. for photovoltaic applications or similar applications for the production of wafers.

According to another advantageous material combination the carrier substrate 2 preferably comprises silicon or sapphire or is preferably made of silicon or sapphire, the detachment layer 8 preferably comprises amorphous silicon or sapphire or is preferably made of amorphous silicon or sapphire, the base layer portion 30 is preferably made of a base layer material, in particular of sapphire, and the main layer portion 32 preferably comprises sapphire or is preferably made of sapphire. By means of this material combination one can advantageously produce layers of solid material from sapphire which are suitable e.g. for display applications.

According to yet another advantageous material combination the carrier substrate 2 preferably comprises silicon or sapphire or silicon carbide or is preferably made of silicon or sapphire or silicon carbide, the detachment layer 8 preferably comprises amorphous silicon or sapphire or silicon carbide or is preferably made of amorphous silicon or sapphire or silicon carbide, the base layer portion 30 is preferably made of a base layer material, in particular of silicon carbide, and the main layer portion 32 preferably comprises silicon carbide or is preferably made of silicon carbide. By means of this material combination one can advantageously produce layers of solid material from silicon carbide.

The portion 8b of the detachment layer 8 remaining on the carrier substrate 2 is preferably prepared and/or used to produce an additional layer elf solid material 1.

Figure 8C:
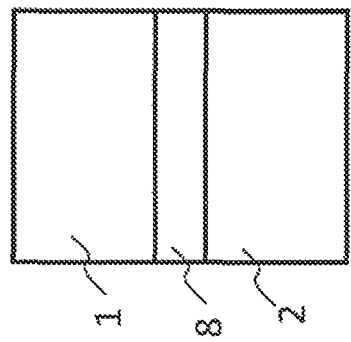
Figure 8B:
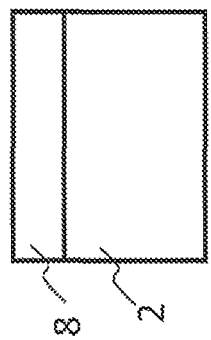
Figure 8A:
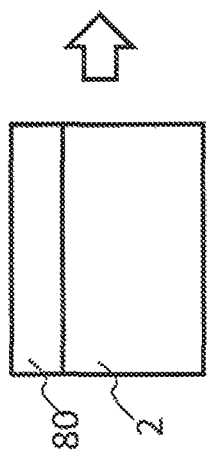

FIG. 8a shows a starter layer 80 positioned over a carrier substrate 2 that is in an amorphous state. The arrow between FIGS. 8a and 8b specifies that the amorphous starter layer 80 from FIG. 8a is converted into a crystalline layer by a treatment, in particular a tempering process, by means of which the detachment layer 8 is produced.

The detachment layer 8 can thus, for example, be produced as a crystalline structure by transforming an amorphous layer 80 previously produced over or in the carrier substrate 2, the carrier substrate 2 being in a crystalline state, and the crystal lattice information on the crystal lattice of the carrier substrate 2 being transferred onto the detachment layer 8 by transforming the amorphous layer into the crystalline detachment layer 8. A layer of solid material 1 produced according to FIG. 8c e.g. by means of epitaxy over the crystalline detachment layer 8 can thus be produced with the crystal lattice information of the carrier substrate 2 without, however, having to be positioned directly on the carrier substrate 2. The carrier substrate 2 here can be e.g. sapphire and the detachment layer 8 can be made e.g. of crystalline silicon and the layer of solid material 1 can be made e.g. of sapphire or silicon carbide.

Alternatively to the transformation of an amorphous material into a crystalline material the detachment layer can, however, also be produced on the carrier substrate in crystalline form, and this is possible, for example, by means of epitaxy.

LIST OF REFERENCE NUMBERS

1 layer of solid material
2 carrier substrate
4 first exposed surface
6 second exposed surface
8 detachment layer
8a first portion of the detachment layer
8b second portion of the detachment layer
9 part of the detachment layer
10 exposed surface
12 free surface
14 receiving layer
16 boundary region
18 separation plane
20 additional receiving layer
30 base layer portion
32 main layer portion
50 additional carrier substrate
80 starter layer
100 additional layer solid material

The invention claimed is:

1. A method of producing at least one layer of solid material comprising:
   providing a carrier substrate with a first exposed surface and with a second exposed surface, the carrier substrate comprising silicon, silicon carbide or sapphire;
   producing an amorphous detachment layer in the carrier substrate by modifying the carrier substrate, the amorphous detachment layer comprising silicon, silicon carbide or sapphire;
   producing a first layer of solid material over the exposed surface of the detachment layer, the first layer of solid material having a free surface spaced apart from the detachment layer, the first layer of solid material comprising silicon, silicon carbide or sapphire;
   positioning or forming a receiving layer on the second exposed surface of the carrier substrate or on the free surface of the first layer of solid material; and
   generating stresses within the detachment layer, the stresses being generated by tempering at least the receiving layer, a crack propagating within the detachment layer, the first layer of solid material being split off from the previously produced multi-layer arrangement by the crack.

* * * * *